United States Patent
Das et al.

(10) Patent No.: US 9,720,117 B1
(45) Date of Patent: Aug. 1, 2017

(54) IMAGING SUBSURFACE PROPERTIES USING A PARALLEL PROCESSING DATABASE SYSTEM

(71) Applicant: Pivotal Software, Inc., Palo Alto, CA (US)

(72) Inventors: Kaushik Kunal Das, Woodside, CA (US); Rashmi Raghu, San Jose, CA (US); Christopher Jeffrey Rawles, Novato, CA (US)

(73) Assignee: Pivotal Software, Inc., San Francisco, CA (US)

( * ) Notice: Subject to any disclaimer, the term of this patent is extended or adjusted under 35 U.S.C. 154(b) by 607 days.

(21) Appl. No.: 14/320,244

(22) Filed: Jun. 30, 2014

(51) Int. Cl.
*G06F 17/50* (2006.01)
*G01V 1/28* (2006.01)
*G01V 99/00* (2009.01)

(52) U.S. Cl.
CPC ............ *G01V 1/282* (2013.01); *G01V 99/005* (2013.01); *G06F 17/5036* (2013.01)

(58) Field of Classification Search
USPC .................................................. 703/2, 6, 18
See application file for complete search history.

(56) References Cited

U.S. PATENT DOCUMENTS

| | | | | |
|---|---|---|---|---|
| 4,072,922 A * | 2/1978 | Taner | ....................... | G01V 1/20 367/63 |
| 8,498,845 B2 * | 7/2013 | Jing | ......................... | G01V 3/38 703/10 |
| 8,762,442 B2 * | 6/2014 | Jeong | ....................... | G06F 17/13 703/2 |
| 9,063,245 B2 * | 6/2015 | Lu | ........................ | G01V 1/282 |
| 2010/0036614 A1 * | 2/2010 | Zuercher | ............... | G01V 1/288 702/16 |
| 2010/0142323 A1 * | 6/2010 | Chu | ....................... | G01V 11/00 367/73 |
| 2011/0108283 A1 * | 5/2011 | Srnka | ..................... | G01V 11/00 166/369 |
| 2011/0246140 A1 * | 10/2011 | Abubakar | ................ | G01V 1/28 703/2 |
| 2011/0264421 A1 * | 10/2011 | Jing | ........................ | G01V 3/38 703/2 |
| 2014/0142860 A1 * | 5/2014 | Lu | ......................... | G01V 1/282 702/16 |

* cited by examiner

*Primary Examiner* — Thai Phan
(74) *Attorney, Agent, or Firm* — Fish & Richardson P.C.

(57) ABSTRACT

Methods, systems, and apparatus, including computer programs encoded on computer storage media, for processing database system processes seismic wave data using database queries. The seismic wave data is obtained from sensors of a reflection seismology survey. The seismic wave data is distributed among nodes of the parallel processing database system. Computations of processing the seismic wave data are performed using relational database queries that execute on the nodes in parallel. These computations performed by the queries include generating a starting Earth model of an area surveyed, and performing iterations of solving a forward problem of generating seismic wave patterns from the starting Earth model, performing local optimization that modifies the starting Earth model, and providing the modified Earth model as input to the forward problem in a next iteration.

39 Claims, 4 Drawing Sheets

IMAGING SUBSURFACE PROPERTIES USING A PARALLEL PROCESSING DATABASE SYSTEM

BACKGROUND

This specification relates to data processing in seismic surveys.

Geological surveys and imaging investigate the geology beneath the ground and are conducted for oil and gas explorations as well as for various scientific purposes such as mapping and modeling. One form of geological survey is a reflection seismology survey, or seismic reflection. In a reflection seismology survey, a controlled seismic source of energy generates seismic waves. The seismic waves travel in the Earth, and are reflected back to surface of the Earth when the seismic waves encounter an interface between two materials having different acoustic impedances. The acoustic impedance of material can be affected by properties, e.g., elasticity, viscoelasticity and density, of the material. Sensors placed on or near the surface of the Earth can detect the seismic waves that are reflected back. By analyzing data recorded by the sensors, an image depicting geological properties under the surface of the Earth can be generated. The image can indicate, for example, where oil or natural gas may be located. A single reflection seismology survey can generate terabytes of data. Processing the data is computationally intensive.

SUMMARY

A parallel processing database system processes seismic wave data using database queries. The seismic wave data is obtained from sensors of a reflection seismology survey. The seismic wave data is distributed among multiple nodes of the parallel processing database system. The nodes can include, or be hosted on, independent and interconnected computers of the parallel processing database system. Each computer can host one or more nodes. Computations processing the seismic wave data are performed using relational database queries that execute on the nodes in parallel. These computations performed by the queries include generating a starting Earth model of an area surveyed, performing iterations of an inverse method which includes solving a forward problem of generating seismic wave patterns from the starting Earth model, performing local optimization that modifies the starting Earth model, and providing the modified Earth model as input to the forward problem in a next iteration. Query optimization techniques available to the parallel processing database system can improve efficiency of the computations over conventional approaches of analyzing seismic wave data.

Particular embodiments of the subject matter described in this specification can be implemented to realize one or more advantages. Compared to a conventional subsurface imaging computing system, the techniques described in this specification can improve speed and accuracy of determining underground features. Due to high demand for computing power, conventional techniques for analyzing seismic survey data often trade between accuracy and speed. By comparison, the techniques described in this specification can quickly analyze seismic survey data without sacrificing accuracy. The techniques can mitigate speed-versus-accuracy trade off by allowing computations on commodity hardware that can easily be scaled up, rather than requiring more expensive supercomputers. Faster processing allows solutions with higher degree of accuracy and certainty, which can lead to less need for drilling.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTIONS OF DRAWINGS

Like reference numbers and designations in the various drawings indicate like elements.

DETAILED DESCRIPTION

Figure 1:
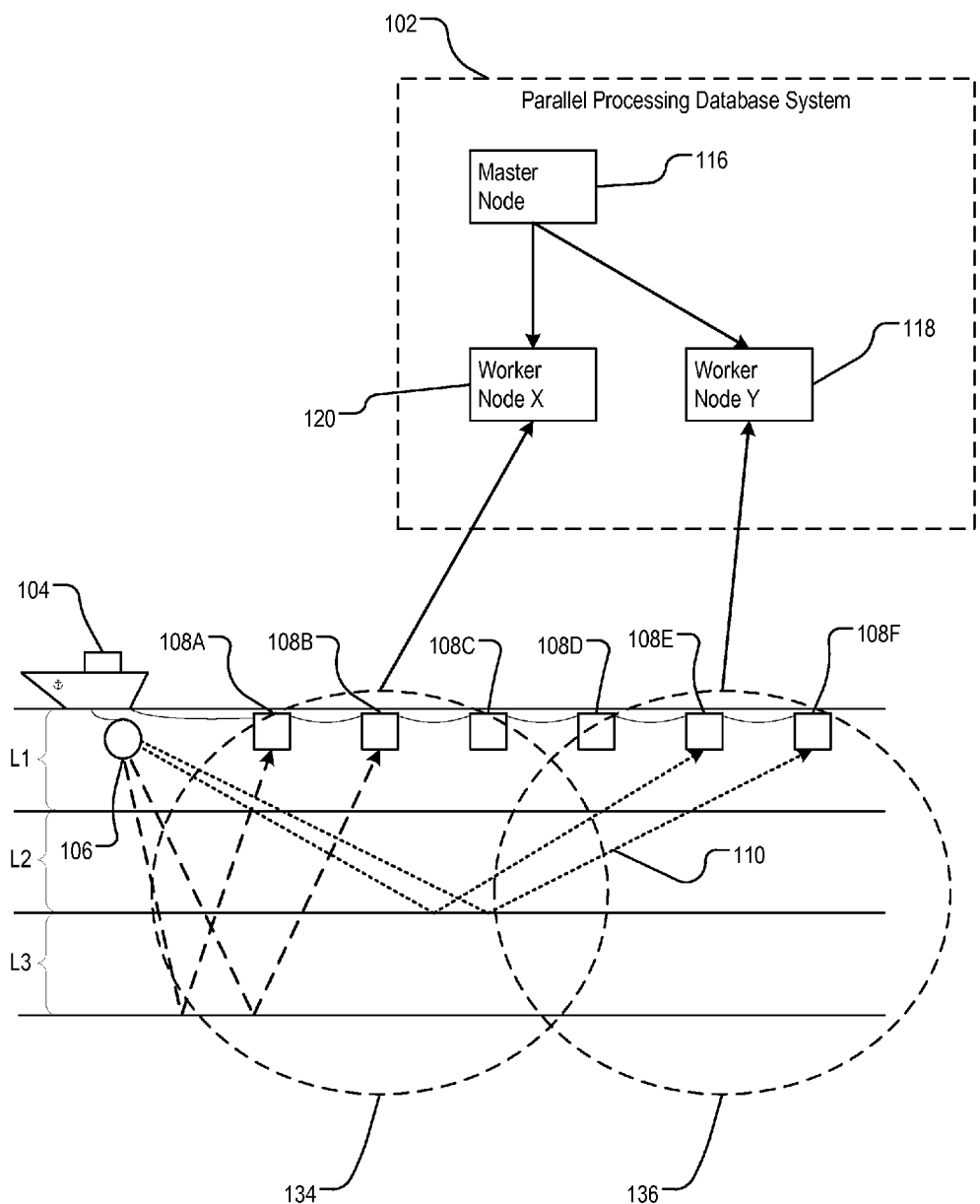
FIG. 1 is a diagram illustrating distributing seismic wave data among nodes of an example parallel processing database system.

FIG. 1 is a diagram illustrating distributing seismic wave data among nodes of an example parallel processing database system 102. The seismic wave data is generated in a reflection seismology survey. In the example shown, a marine seismic survey is described. The techniques described in the specification are also applicable to seismic wave data generated by land seismic surveys based on similar scientific principles.

A marine seismic survey is performed by a system that includes a survey ship 104 equipped with a seismic source 106. The seismic source 106 can be a sound source, e.g., an air gun. The survey ship 104 tows one or more streamers beneath a water surface. Each streamer includes a cable and a series of sensors, e.g., acoustic sensors 108A through 108F, attached to the cable and spread out at constant intervals. The acoustic sensors 108A through 108F can be hydrophones.

The seismic source 106, when fired, generates seismic waves in the form of acoustic waves 110. The acoustic waves 110 can be reflected by interfaces of different materials. For example, a geographic area being surveyed can have three layers L1 (water), L2 (rocks of a first type), and L3 (rocks of a second type), each having a different acoustic impedance. The different acoustic impedances are caused by different density, elasticity, and/or viscoelasticity of the materials. The acoustic waves 110 travel at different speeds in layers L1, L2, and L3. The reflected acoustic waves 110 can travel to acoustic sensors 108A through 108F.

Using inputs including data recorded by the sensors, data from the seismic source 106, the parallel processing database system 102 can build an image of the geological features that are under the surface of the Earth. The parallel processing database system 102 includes one or more clusters of computers for processing the seismic wave data collected by the acoustic sensors 108A through 108F. For simplicity, one cluster is shown. Each cluster of computers includes a computer designated as master node 116 and multiple computers designated as worker nodes 118 and 120. The master node 116 manages distributed storage of seismic wave data and manages parallel processing of the seismic wave data by the worker nodes 118 and 120. The worker nodes 118 and 120 that store the seismic wave data and perform computations on the seismic wave data to generate an image of a surveyed area, according to the instructions received from the master node 116. Each of the nodes 116, 118, 120 can include a respective computer, be hosted on a respective computer, or be hosted on a same computer shared with one another.

The parallel processing database system 102 distributes the seismic wave data to worker nodes 118 and 120 based on topology of the parallel processing database system 102. In some implementations, the parallel processing database system 102 distributes seismic wave data of acoustic sensors that are close to one another to a same worker node 120. For example, the parallel processing database system 102 can distribute seismic wave data on two groups of acoustic sensors, e.g., group 134 that includes acoustic sensors 108A, 108B, and 108C, and neighboring group 136 that includes acoustic sensors 108D, 108E, and 108F, to worker nodes that are close together in a network topology of the parallel processing database system 102, e.g., under a same network router or network gateway. Each of the worker nodes 118 and 120 can then process the seismic wave data in parallel to one another using database operations. Computations for processing the seismic wave data are described below in reference to FIG. 2.

In some implementations, the parallel processing database system 102 distributes seismic wave data of acoustic sensors to worker nodes based on pixels or grid points of the image of geological features to be generated. Each pixel or grid point corresponds to a discretized location in a virtual mesh of the surveyed area. The parallel processing database system 102 distributes the discretized locations that are close to one another, e.g., those corresponding to neighboring pixels, to a same worker node or to worker nodes that are located closer to each other according to the network topology of the parallel processing database system 102.

Figure 2:
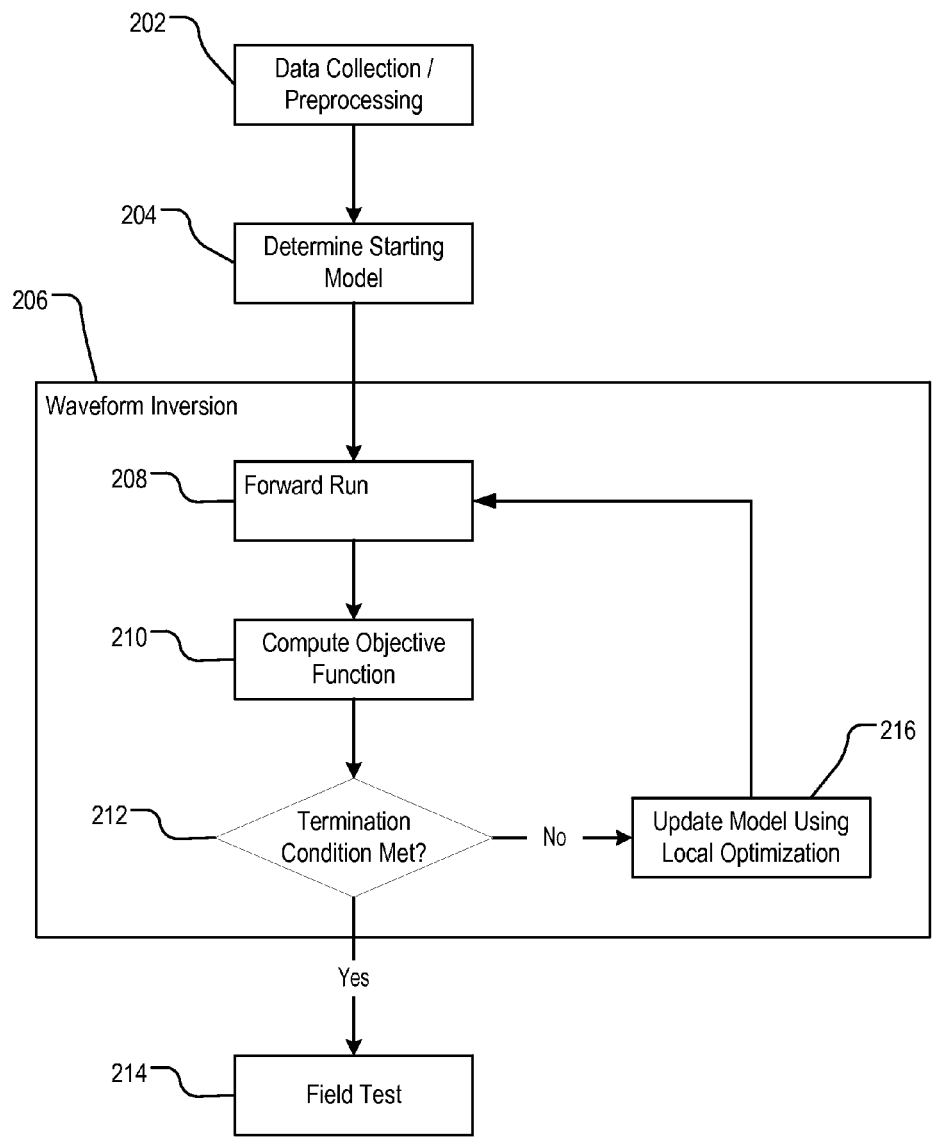
FIG. 2 is a flowchart illustrating computations performed in analyzing seismic wave data to generate an image.

FIG. 2 is a flowchart illustrating computations performed in analyzing seismic wave data to generate an image of geological features. A system, e.g., the parallel processing database system 102, collects and preprocesses (202) the seismic wave data. The seismic wave data includes information on attributes and placement of the sensors, information on attributes, operations, and characteristics of the seismic source, and readings of seismic waves by the acoustic sensors. Preprocessing the seismic wave data can include filtering the seismic wave data to remove noise, and building and populating multiple database tables distributed on multiple nodes. The database tables store the acoustic sensor readings as well as seismic wave velocity information.

The system determines (204) a starting Earth model "m" that represents geological features of a geographic area surveyed. The geological features include the underground structure of the geographic area. The starting Earth model m can be a simple model of the surveyed area that coarsely maps to the seismic wave data. For example, the starting Earth model m can specify that the surveyed area has three layers. The system then performs waveform inversion 206 in multiple iterations to determine geographic features of the surveyed area. The waveform inversion includes solving 208 a forward problem based on the initial Earth model m using a linear or nonlinear solver provided as a database function by the system. Results of solving the forward problem include a seismic wave pattern generated according to wave propagation properties following the starting Earth model. The seismic wave pattern is a projected seismic wave pattern as if the seismic waves pass through the geological features of the initial Earth model. The system can then adjust the initial Earth model based on a difference between the forward propagation model and the received seismic wave data, which can be a difference between computed seismic wave results and recorded seismic wave data.

In some implementations, solving 208 the forward problem includes solving a two-dimensional Helmholtz equation using a second order finite difference scheme as follows.

$$Su = f \tag{1}$$

In this scheme, S is a differential operator including velocity variations, u is a complex pressure field to be solved, and f is a source term representing properties of a seismic source generating the seismic wave, e.g., the seismic source 106 of FIG. 1. In some implementations, the differential operator S can be a finite-difference operator.

The differential operator S enables discretization of the partial differential equation, which is to be solved in the forward run, so that the equation can be solved numerically using computers.

$$\frac{\partial^2 \hat{p}}{\partial x^2} + \frac{\partial^2 \hat{p}}{\partial z^2} + \frac{\omega^2}{c^2}\hat{p} = -S_f \tag{2}$$

Equation (2) is the Helmholtz equation example that can be discretized as equation (1). In equation (2), x represents one of the dimensions, e.g., distance to a reference point. The reference can be a sound source or a point that is different from a sound source; z represents another dimension, e.g., depth; p represents pressure; co represents angular frequency in the frequency domain; $S_f$ represents source terms and c represents wave velocity.

The system can solve the two-dimensional Helmholtz equation using a linear solver module stored in a library of the parallel processing database system. The linear solver executes a structured query language (SQL) routine that includes one or more SQL statements. Pseudo code for an example SQL statement for solving the two-dimensional Helmholtz equation is provided below.

$$\text{SELECT } db\_lib.\text{linear\_solver}(tbl\_source\_lhs, tbl\_source\_rhs \ldots ); \tag{3}$$

In statement (3), db_lib is a library of the parallel processing database system, linear_solver is the linear solver module provided in the library, the tbl_source_lhs is the differential operator S as described above, and the tbl_source_rhs is the source term f as described above.

The system computes (210) an objective function to minimize a difference between the observed seismic wave data and seismic wave patterns generated from the Earth model m. In some implementations, the objective + function is defined based on a least-squares local optimization model (4) below.

$$\Delta d = d_{abs} - d_{cal}(m);$$

$$C(m) = \tfrac{1}{2}\Delta d^\dagger \Delta d \tag{4}$$

In the local optimization model (4), C(m) is the objective function to minimize; $d_{obs}$ represents the received seismic wave data, $d_{cal}$ represents seismic wave patterns derived from Earth model m. $\Delta d$ is a difference between $d_{obs}$ and $d_{cal}$.

The system determines (212) whether C(m) satisfies a termination condition. The termination condition can be convergence of the differences between N consecutive iterations, a threshold value, or a number of iterations. Upon determining that the termination condition is satisfied, the system can provide the Earth model m for field testing 214, including, for example, generating one or more images of the geological features of Earth model m. Field testing 214 can include drilling at locations that have certain features in the Earth model m that correspond to rock types that indicate presence of minerals, for example, or other resources.

Upon determining that C(m) does not satisfy the termination condition, the system updates (216) Earth model m using local optimization. The local optimization can include performing linear approximation using a perturbation model as shown below.

$$m = m_0 + \Delta m \quad (5)$$

where $m_0$ is the Earth model in a current iteration; m is a new Earth model that will be used in a next iteration, and $\Delta m$ is a change to the Earth model in the current iteration to go to the next iteration. To minimize C(m), optimization methods such as Gradient or Steepest Descent, Gauss-Newton method, Levenberg-Marquardt method etc. can be applied in (216). In the case of the Steepest Descent method, to determine $\Delta m$, the system computes a gradient of the objective function and updates the Earth model m in an opposite direction to the gradient. The system can compute $\Delta m$ using a SQL function that performs the following calculations.

$$\Delta m = -\alpha \nabla_m C, \quad (6)$$

$$\nabla_m C = \frac{\partial C}{\partial m}$$

In calculations (6), $\nabla_m C$ is the gradient, and $\alpha$ is a step size. A larger $\alpha$ value corresponds to a more radical change in the Earth model. The system can use an adjoint method to determine the gradient. The adjoint method can be a SQL function provided by the parallel processing database system.

In various implementations, the system can invoke quasi-Newton, Gauss-Newton, Levenberg-Marquardt, or full Newton methods to solve the least-squares local optimization model (4). Depending on the local optimization method chosen, quantities other than the gradient (such as Hessian etc.) can be computed. The direction of Earth model update may also be different from the direction that is exactly opposite of the gradient direction.

The inverse problem may be an ill-posed problem having non-unique solutions. The system can solve the ill-posed problem, or to avoid over-fitting, by regularization, introducing additional information to the model, or both. For example, the system introduces Tikhonov regularization and a priori knowledge for stabilization (7).

$$C(m) = C_d(m) + \lambda_1 C_{1m}(m) + \lambda_2 C_{2m}(m) \quad (7)$$

In the stabilization operations (7), C(m) is the objective function, $C_d(m)$ represents a data residual that indicates a difference between a calculated seismic wave pattern and observations from the seismic wave data. For example, $C_d(m)$ can be ½Δd†Δd. $\lambda_1$ is a weighting of regularization, $C_{1m}(m)$ represents regularization for finding a smoothest model that explains the data. The regularization can be Tikhonov regularization defined as follows:

$$C_{1m}(m) = \|B_x m\|^2 + \|B_z m\|^2 \quad (8)$$

In the Tikhonov regularization, $B_x$ represents the first-order derivative operator in the x dimension; and $B_z$ represents the first-order derivative operator in the z, e.g., depth, dimension. $\|B_x m\|$ can be a norm operation, e.g., L2-norm that represents a magnitude of $B_x$ of the Earth model m.

In stabilization operations (7) above, the $\lambda_2$ is a weight of the a priori knowledge that is external to the seismic wave data. This knowledge can include, for example, data from already drilled wells, geologic constraints, and data determined through seismic tomography. The a priori knowledge can be introduced as follows.

$$C_{2m}(m) = \|W_m(m - m_p)\|^2 \quad (9)$$

where $W_m$ is the a weighting operator on the model space, and $m_p$ is the a priori knowledge.

Figure 3:
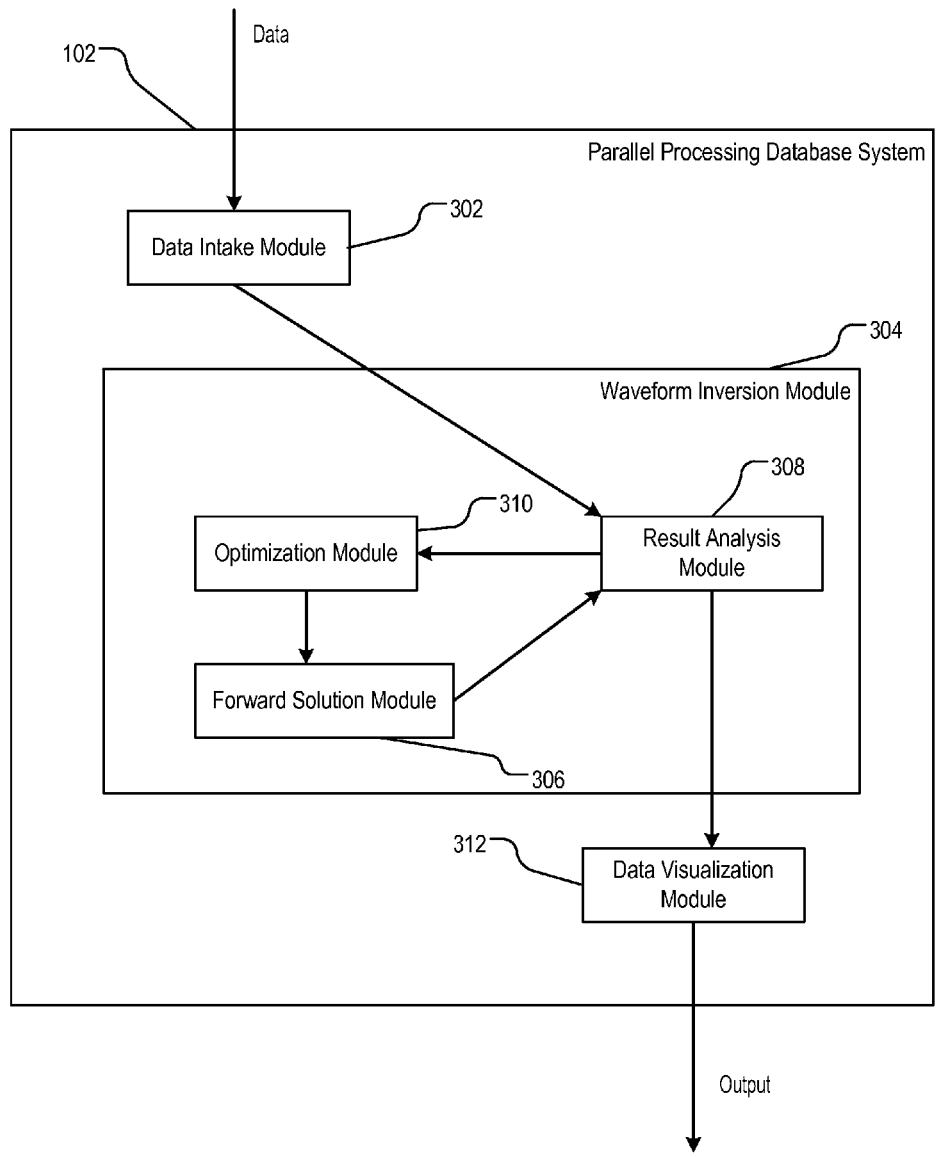
FIG. 3 is a block diagram illustrating components of an example parallel processing database system for processing seismic wave data.

FIG. 3 is a block diagram illustrating components of an example parallel processing database system 102 for processing seismic wave data. The parallel processing database system 102 includes multiple functional modules each being implemented on one or more computers of the parallel processing database system 102.

The parallel processing database system 102 includes a data intake module 302. The data intake module 302 is a component of the parallel processing database system 102 configured to parse seismic wave data obtained from one or more acoustic sensors, to determine parameters of the inverse problem. In addition, the data intake module 302 creates one or more database tables and inserts the parameters into the database tables. The data intake module 302 can distribute the database tables among one or more worker nodes of the parallel processing database system 102. The data intake module 302 can include one or more system scripts and one or more SQL routines. Each SQL routine can be a routine stored in database library and can include one or more SQL statements. The data intake module 302 includes a preprocessor module configured to determine an initial Earth model or receive an initial Earth model as a user input.

The parallel processing database system 102 includes a waveform inversion module 304. The waveform inversion module 304 is a component of the parallel processing database system 102 that executes one or more SQL routines to determine an Earth model representing geological features of a surveyed area. The waveform inversion module 304 determines an improved Earth model in each of one or more iterations. The waveform inversion module 304 includes a forward solution module 306.

The forward solution module 306 is a component of the waveform inversion module 304 that executes one or more SQL routines to solve a forward problem. The forward solution module 306 determines a seismic wave pattern from the initial Earth model provided by the data intake module 302 in a first iteration. In each subsequent iteration, the forward solution module 306 determines an updated seismic wave pattern from an Earth model of a previous iteration.

The waveform inversion module 304 includes a result analysis module 308. The result analysis module 308 executes one or more SQL routines to compute an objective function of minimizing a difference between the seismic wave pattern generated by the forward solution module 306 and received seismic data that includes survey observations. The result analysis module 308 determines whether a termination condition is satisfied. Upon determining that the termination condition is not satisfied, the result analysis module 308 can start a next iteration of determining a modified Earth model of modified geological features using an optimization module 310.

The optimization module 310 is a component of the parallel processing database system that executes one or more SQL routines to perform local optimization, including modifying the geological features of the Earth model from the forward solution module 306. The optimization module 310 provides an updated Earth model to the forward solution module 306 for a next iteration.

Upon determining that the termination condition is satisfied, the result analysis module 308 provides the geological features in the Earth model to a data visualization module 312. The data visualization module 312 is a functional module of the parallel processing database system 102 that generates images of the geological features for users.

Figure 4:
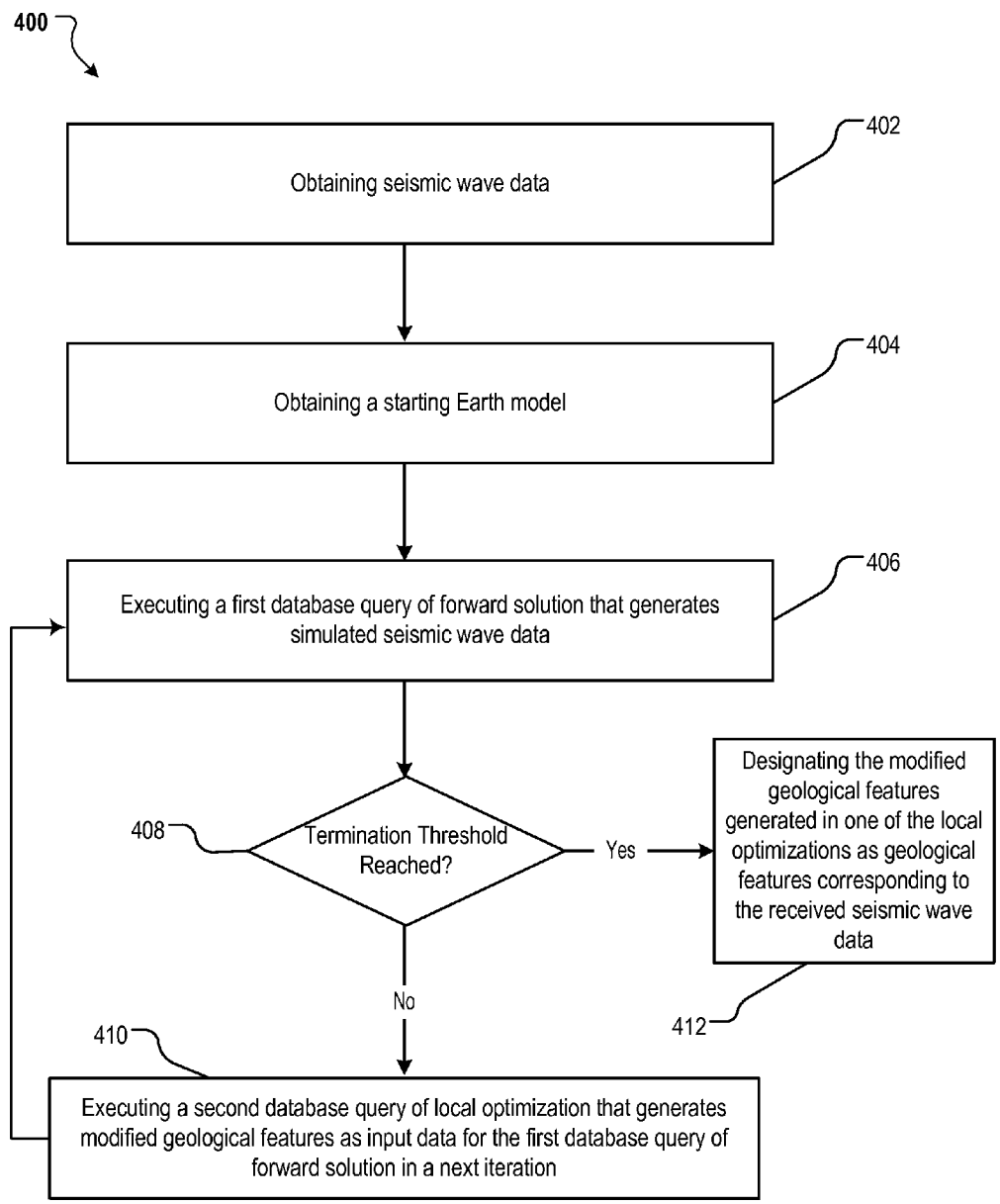
FIG. 4 is a flowchart illustrating an example process of generating an image of subsurface structures based on seismic wave data on a parallel processing database system.

FIG. 4 is a flowchart illustrating an example process 400 of generating an image of subsurface structures based on seismic wave data on a parallel processing database system. The parallel processing database system includes a relational database distributed on multiple nodes each including one or more computers. The parallel processing database system can be system 102 of FIG. 1 and FIG. 3.

The system receives (402) seismic wave data. The seismic wave data includes readings from multiple sensors located in a three-dimensional geographic area divided into multiple three-dimensional cells. Each sensor can be an acoustic sensor, e.g., a geophone or hydrophone. The system distributes the received seismic wave data to the nodes. Readings from sensors that are located closer to each other can be distributed to nodes that are located closer to each other according to a networking topology of the parallel processing database system.

The system obtains (404) a starting Earth model by receiving or determining the starting Earth model. The starting Earth model represents one or more estimated geological features of the geographic area. The starting Earth model can be a rough estimate of geological features from the received seismic wave data. In some implementations, the starting Earth model can be a user input. The system can distribute the starting Earth model to nodes. Distribution strategy can include distributing the Earth model according to location, where Earth model values at given locations can be distributed close to values from the same and surrounding locations.

The system determines geological features of the geographic area from the seismic wave data and initial Earth model in one or more iterations. The geological features include elasticity and/or viscoelasticity properties, density properties, or both, of each of multiple discrete points of the geographic area. Each point can be analogous to a pixel or grid point of the image. The system can start the iterations from the starting Earth model of geological features. Each of the nodes performs some computations related to each iteration on the seismic wave data distributed to that node in parallel to other nodes. In each iteration, the system performs the following operations.

The each node of the system executes (406) a first database query of forward solution. The first database query includes a first relational database routine. The first relational database routine of the first database query of forward solution can include a call to a stored procedure of the relational database. The stored procedure includes SQL statements and UDFs (User-defined Functions) for generating simulated seismic wave data from an input Earth model. Upon execution by the system, the routine generates seismic wave data from input data. The input data initially includes the starting Earth model of geological features. The stored procedure can include a solver operable to solve an equation for determining seismic wave patterns from the geological features based on wave propagation characteristics using database operations. The solver can be an in-database linear or nonlinear solver. The equation can be a two-dimensional Helmholtz equation. In the example of the Helmholtz equation, the solver is configured to receive, as inputs, a differential operator including seismic wave velocity values (and seismic wave field values, including but not limited to pressure values in the case of non-linear equations) as left hand side of the equation, and characteristics of the seismic wave source (and other sources) as right hand side of the equation. For other linear or nonlinear forward model (wave propagation) equations the solver is configured appropriately with respect to those equations.

The system determines (408) whether a termination condition is satisfied. At least a portion of the termination condition specifies that a difference between (1) the simulated seismic wave data generated by the first database query and the second database query and (2) the received seismic wave data satisfy a termination threshold.

If the difference does not satisfy the termination threshold, the system executes (410) a second database query of local optimization. The second database query includes a second relational database routine. The second relational database routine includes a call to a stored procedure that is configured to calculate a gradient and, optionally, Hessian and other information needed for the chosen local optimization algorithm of an Earth model that includes candidate geological features. The stored procedure can modify the candidate geological features in a direction that is opposite to the gradient in a gradient descent algorithm. If another algorithm, e.g., Levenberg-Marquardt algorithm is employed, the direction can be different from the opposite to the gradient. Upon execution by the system, the second relational database routine generates modified geological features as input Earth model for the first database query of forward solution in a next iteration. The system then performs the next iteration. Each of the first relational database routine and second relational database routine can include a call to a procedure language/Postgre structured query language (PL/pgSQL) database procedure stored in the relational database or a PL/Python database procedure stored in the relational database. In various implementations, the database procedure can be in various languages, e.g., SQL, C, PL/Java, PL/R, or PL/Perl.

If the difference does satisfy the termination threshold, the system terminates the iterations. The system designates (412) the geological features generated in one of the iterations, e.g., in the last iteration, as geological features corresponding to the received seismic wave data. The system can generate an image of subsurface structures of a portion of Earth representing the geological features corresponding to the received seismic wave data. Each pixel or grid point of the image can correspond to a discrete point in the forward solution and local optimization.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, a computer, or multiple processors or computers. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communications network. Examples of communications networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, the subject matter is described in context of scientific papers. The subject matter can apply to other indexed work that adds depth aspect to a search. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:

1. A method, comprising:
obtaining seismic wave data by a parallel processing database system that includes one or more computers, including receiving or generating the seismic wave data, the parallel processing database system including a relational database distributed on a plurality of nodes, the seismic wave data including readings from a plurality of sensors configured to monitor seismic waves of a geographic area, the seismic waves being generated by one or more seismic wave sources;
obtaining a starting Earth model by the parallel processing database system, including receiving or generating the starting Earth model, the starting Earth model representing one or more estimated geological features of the geographic area; and
determining geological features of the geographic area in one or more iterations, the geological features including at least one of an elasticity or viscoelasticity property or a density property for each of a plurality of discrete points in the geographic area, wherein each iteration of determining the geological features comprises:
executing a first database query of forward solution, the first database query including a first relational database routine that, upon execution by the parallel processing database system, generates simulated seismic wave data from an input Earth model, the input Earth model initially including the starting Earth model;
determining whether a termination condition is satisfied, at least a portion of the termination condition specifying that a difference between the simulated seismic wave data generated by the first database query and the received seismic wave data satisfy a termination threshold;
if the difference does not satisfy the termination threshold, executing a second database query of local optimization, the second database query including a second relational database routine that, upon execution by the parallel processing database system, generates a modified Earth model as the input Earth model for the first database query in a next iteration; and
if the difference satisfies the termination threshold, terminating the one or more iterations and designating geological features in the modified Earth models generated in one of the iterations as geological features corresponding to the received seismic wave data.

2. The method of claim 1, comprising distributing the received seismic wave data to the nodes, wherein readings from sensors that are located closer to one another are distributed to nodes that are located closer to each other according to a networking topology of the parallel processing database system, and wherein, in each iteration, each of the nodes performs one or more computations of that iteration on the seismic wave data distributed to that node in parallel to other node.

3. The method of claim 1, wherein the first relational database routine of the first database query of forward solution includes a call to a first stored procedure that includes a solver operable to solve an equation for determining seismic wave patterns from the geological features based on wave propagation characteristics using database operations.

4. The method of claim 3, wherein:
the equation is an equation of a linear forward model,
the first relational database routine includes, prior to calling the first stored procedure, discretizing or approximating the equation, and
the solver includes an in-database linear solver that receives, as inputs, a differential operator including seismic wave velocity values and seismic wave field values as left hand side of the equation and characteristics of the seismic wave source as right hand side of the equation.

5. The method of claim 3, wherein:
the equation is an equation of a nonlinear forward model; and
the solver includes an in-database nonlinear solver.

6. The method of claim 5, wherein the in-database nonlinear solver is based on Newton-Raphson method and invokes a linear solver.

7. The method of claim 3, wherein the equation is a Helmholtz equation.

8. The method of claim 1, wherein the second relational database routine includes a call to a first procedure that performs Tikhonov regularization on seismic wave patterns.

9. The method of claim 1, wherein the second relational database routine of the second database query of local optimization includes a call to a stored procedure that is configured to:
apply at least one of a steepest descent method, a Gauss-Newton method, or a Levenberg-Marquardt method to the Earth model; and
calculate a gradient of an optimization objective function.

10. The method of claim 9, wherein the stored procedure applies the steepest descent method and is configured to:
calculate a gradient of an Earth model that includes candidate geological features generated by the second database query, and
modify the candidate geological features in a direction that is opposite to the gradient.

11. The method of claim 1, wherein each of the first relational database routine and second relational database routine includes a call to a procedure language/Postgre structured query language (PL/pgSQL) database procedure stored in the relational database or a SQL, C, PL/Python, PL/Java, PL/R, or PL/Perl database procedure stored in the relational database.

12. The method of claim 1, wherein each of the sensors is a geophone or a hydrophone.

13. The method of claim 1, comprising generating an image of subsurface structures of a portion of Earth representing the geological features corresponding to the received seismic wave data.

14. A non-transitory storage device storing instructions operable to cause a parallel processing database system including one or more computers to perform operations comprising:
 obtaining seismic wave data, including receiving or generating the seismic wave data, the parallel processing database system including a relational database distributed on a plurality of nodes, the seismic wave data including readings from a plurality of sensors configured to monitor seismic waves of a geographic area, the seismic waves being generated by one or more seismic wave sources;
 obtaining a starting Earth model by the parallel processing database system, including receiving or generating the starting Earth model, the starting Earth model representing one or more estimated geological features of the geographic area; and
 determining geological features of the geographic area in one or more iterations, the geological features including at least one of an elasticity or viscoelasticity property or a density property for each of a plurality of discrete points in the geographic area, wherein each iteration of determining the geological features comprises:
  executing a first database query of forward solution, the first database query including a first relational database routine that, upon execution by the parallel processing database system, generates simulated seismic wave data from an input Earth model, the input Earth model initially including the starting Earth model;
  determining whether a termination condition is satisfied, at least a portion of the termination condition specifying that a difference between the simulated seismic wave data generated by the first database query and the received seismic wave data satisfy a termination threshold;
  if the difference does not satisfy the termination threshold, executing a second database query of local optimization, the second database query including a second relational database routine that, upon execution by the parallel processing database system, generates a modified Earth model as the input Earth model for the first database query in a next iteration; and
  if the difference satisfies the termination threshold, terminating the one or more iterations and designating geological features in the modified Earth models generated in one of the iterations as geological features corresponding to the received seismic wave data.

15. The non-transitory storage device of claim 14, the operations comprising distributing the received seismic wave data to the nodes, wherein readings from sensors that are located closer to one another are distributed to nodes that are located closer to each other according to a networking topology of the parallel processing database system, and wherein, in each iteration, each of the nodes performs one or more computations of that iteration on the seismic wave data distributed to that node in parallel to other node.

16. The non-transitory storage device of claim 14, wherein the first relational database routine of the first database query of forward solution includes a call to a first stored procedure that includes a solver operable to solve an equation for determining seismic wave patterns from the geological features based on wave propagation characteristics using database operations.

17. The non-transitory storage device of claim 16, wherein:
 the equation is an equation of a linear forward model,
 the first relational database routine includes, prior to calling the first stored procedure, discretizing or approximating the equation, and
 the solver includes an in-database linear solver that receives, as inputs, a differential operator including seismic wave velocity values and seismic wave field values as left hand side of the equation and characteristics of the seismic wave source as right hand side of the equation.

18. The non-transitory storage device of claim 16, wherein:
 the equation is an equation of a nonlinear forward model; and
 the solver includes an in-database nonlinear solver.

19. The non-transitory storage device of claim 18, wherein the in-database nonlinear solver is based on Newton-Raphson method and invokes a linear solver.

20. The non-transitory storage device of claim 16, wherein the equation is a Helmholtz equation.

21. The non-transitory storage device of claim 14, wherein the second relational database routine includes a call to a first procedure that performs Tikhonov regularization on seismic wave patterns.

22. The non-transitory storage device of claim 14, wherein the second relational database routine of the second database query of local optimization includes a call to a stored procedure that is configured to:
 apply at least one of a steepest descent method, a Gauss-Newton method, or a Levenberg-Marquardt method to the Earth model; and
 calculate a gradient of an optimization objective function.

23. The non-transitory storage device of claim 22, wherein the stored procedure applies the steepest descent method and is configured to:
 calculate a gradient of an Earth model that includes candidate geological features generated by the second database query, and
 modify the candidate geological features in a direction that is opposite to the gradient.

24. The non-transitory storage device of claim 14, wherein each of the first relational database routine and second relational database routine includes a call to a procedure language/Postgre structured query language (PL/pgSQL) database procedure stored in the relational database or a PL/Python, PL/Java, PL/R, or PL/Perl database procedure stored in the relational database.

25. The non-transitory storage device of claim 14, wherein each of the sensors is a geophone or a hydrophone.

26. The non-transitory storage device of claim 14, the operations comprising generating an image of subsurface structures of a portion of Earth representing the geological features corresponding to the received seismic wave data.

27. A parallel processing database system comprising:
 one or more computers; and
 one or more non-transitory storage device storing instructions operable to cause the one or more computers to perform operations comprising:
  obtaining seismic wave data, including receiving or generating the seismic wave data, the parallel processing database system including a relational database distributed on a plurality of nodes, the seismic wave data including readings from a plurality of sensors configured to monitor seismic waves of a geographic area, the seismic waves being generated by one or more seismic wave sources;

obtaining a starting Earth model by the parallel processing database system, including receiving or generating the starting Earth model, the starting Earth model representing one or more estimated geological features of the geographic area; and determining geological features of the geographic area in one or more iterations, the geological features including at least one of an elasticity or viscoelasticity property or a density property for each of a plurality of discrete points in the geographic area, wherein each iteration of determining the geological features comprises:

executing a first database query of forward solution, the first database query including a first relational database routine that, upon execution by the parallel processing database system, generates simulated seismic wave data from an input Earth model, the input Earth model initially including the starting Earth model;

determining whether a termination condition is satisfied, at least a portion of the termination condition specifying that a difference between the simulated seismic wave data generated by the first database query and the received seismic wave data satisfy a termination threshold;

if the difference does not satisfy the termination threshold, executing a second database query of local optimization, the second database query including a second relational database routine that, upon execution by the parallel processing database system, generates a modified Earth model as the input Earth model for the first database query in a next iteration; and if the difference satisfies the termination threshold, terminating the one or more iterations and designating geological features in the modified Earth models generated in one of the iterations as geological features corresponding to the received seismic wave data.

28. The parallel processing database system of claim 27, the operations comprising distributing the received seismic wave data to the nodes, wherein readings from sensors that are located closer to one another are distributed to nodes that are located closer to each other according to a networking topology of the parallel processing database system, and wherein, in each iteration, each of the nodes performs one or more computations of that iteration on the seismic wave data distributed to that node in parallel to other node.

29. The parallel processing database system of claim 27, wherein the first relational database routine of the first database query of forward solution includes a call to a first stored procedure that includes a solver operable to solve an equation for determining seismic wave patterns from the geological features based on wave propagation characteristics using database operations.

30. The parallel processing database system of claim 29, wherein:
the equation is an equation of a linear forward model,
the first relational database routine includes, prior to calling the first stored procedure, discretizing or approximating the equation, and
the solver includes an in-database linear solver that receives, as inputs, a differential operator including seismic wave velocity values and seismic wave field values as left hand side of the equation and characteristics of the seismic wave source as right hand side of the equation.

31. The parallel processing database system of claim 29, wherein:
the equation is an equation of a nonlinear forward model; and
the solver includes an in-database nonlinear solver.

32. The parallel processing database system of claim 31, wherein the in-database nonlinear solver is based on Newton-Raphson method and invokes a linear solver.

33. The parallel processing database system of claim 29, wherein the equation is a Helmholtz equation.

34. The parallel processing database system of claim 27, wherein the second relational database routine includes a call to a first procedure that performs Tikhonov regularization on seismic wave patterns.

35. The parallel processing database system of claim 27, wherein the second relational database routine of the second database query of local optimization includes a call to a stored procedure that is configured to:
apply at least one of a steepest descent method, a Gauss-Newton method, or a Levenberg-Marquardt method to the Earth model; and
calculate a gradient of an optimization objective function.

36. The parallel processing database system of claim 35, wherein the stored procedure applies the steepest descent method and is configured to:
calculate a gradient of an Earth model that includes candidate geological features generated by the second database query, and
modify the candidate geological features in a direction that is opposite to the gradient.

37. The parallel processing database system of claim 27, wherein each of the first relational database routine and second relational database routine includes a call to a procedure language/Postgre structured query language (PL/pgSQL) database procedure stored in the relational database or a PL/Python, PL/Java, PL/R, or PL/Perl database procedure stored in the relational database.

38. The parallel processing database system of claim 27, wherein each of the sensors is a geophone or a hydrophone.

39. The parallel processing database system of claim 27, the operations comprising generating an image of subsurface structures of a portion of Earth representing the geological features corresponding to the received seismic wave data.

* * * * *